Figure 1:
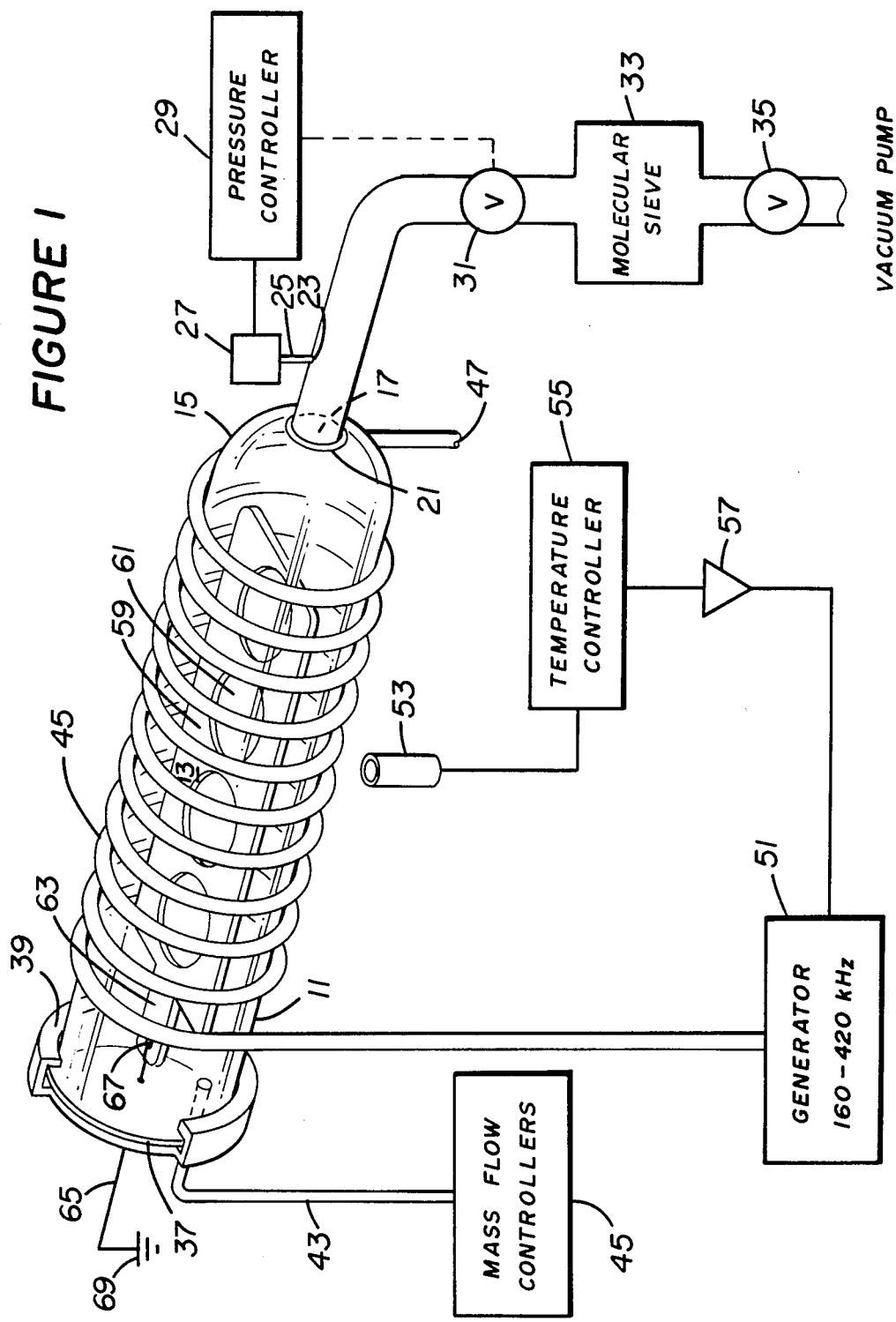

United States Patent [19]
Delfino et al.

[11] Patent Number: 4,686,113
[45] Date of Patent: Aug. 11, 1987

[54] PLASMA CONFINEMENT IN A LOW PRESSURE ELECTRICALLY GROUNDED R.F. HEATED REACTOR AND DEPOSITION METHOD

[75] Inventors: Michelangelo Delfino, Los Altos; Bruce R. Cairns, Los Altos Hills, both of Calif.

[73] Assignee: Fairchild Semiconductor Corporation, Cupertino, Calif.

[21] Appl. No.: 810,954

[22] Filed: Dec. 18, 1985

[51] Int. Cl.⁴ .............................................. B05D 3/02
[52] U.S. Cl. ................................. 427/45.1; 118/50.1; 118/723; 427/255; 427/264
[58] Field of Search .............................. 118/723, 50.1; 427/45.1, 264, 255

[56] References Cited

U.S. PATENT DOCUMENTS 3,980,854  9/1976  Berkman et al. ................... 427/45.1
4,298,629  11/1981  Nozaki et al. ....................... 427/45.1

Primary Examiner—Norman Morgenstern
Assistant Examiner—Janyce A. Bell
Attorney, Agent, or Firm—Stephen J. Phillips; David H. Carroll; James A. LaBarre

[57] ABSTRACT

A deposition reactor system is described for producing a coating containing a predetermined component on a substrate from a plasma containing such component in an ionized state. The substrate is supported on a susceptor within a reactor chamber to which is introduced a gas containing the predetermined component. A radio frequency field is inductively coupled to the gas, forming a plasma in the reactor chamber in the region of the susceptor. The susceptor is maintained at ground potential in the radio frequency field.

9 Claims, 2 Drawing Figures

PLASMA CONFINEMENT IN A LOW PRESSURE ELECTRICALLY GROUNDED R.F. HEATED REACTOR AND DEPOSITION METHOD

This invention relates to deposition systems and methods and, more particularly, to a deposition reactor system and method for producing a coating containing a predetermined component on a substrate from a plasma containing such component in an ionized state.

The deposition of gaseous components on a substrate from an ionized plasma is known. For example, silicon semiconductor wafers have been provided with silicon nitride coatings from a plasma containing ionized nitrogen. The plasma can be produced in a variety of ways in such prior art systems including the use of radio frequency electrostatic or electromagnetic fields.

Where electrostatic fields are used, radio frequency energy is capacitively coupled into the plasma gas by a suitable arrangement of plate electrodes or the like. Often these plate electrodes comprise structural parts of the reactor or comprise elements which support the substrate upon which the deposition is occurring.

The use of capacitively coupled systems for producing deposition plasmas, although common, is not without problems. A minor degree of sputtering or ion implantation is almost always present in such systems and results often in unsatisfactory coating quality. Moreover, in capacitively coupled systems, it is sometimes more difficult to confine the plasma to the parts being coated. If the plasma comes in contact with metallic end walls or various other parts of the reactor, it can become contaminated by grease or similar materials, resulting in contamination of the substrate.

In other systems in the prior art, an induction coil is used to produce an electromagnetic field which is inductively coupled to the plasma gas. Application of radio frequency current to the coil results in ionization of the gas within the space surrounded by the coil.

The use of an inductively coupled system sometimes reduces problems in connection with confining the plasma to the area of interest, and also reduces the likelihood of sputtering and ion implantation. However, even with inductively coupled systems, contamination can result. Contamination may be exacerbated when scaling up the size of reactor systems for coating relatively large substrates. The increased power levels typically necessary when a system is scaled up may result in increased arcing. This can cause contamination from reactions with the loading door, the vacuum pump, or the like. Although arcing can sometimes be reduced by the use of higher gas pressures, this may be undesirable in many processes.

An additional problem present in prior art inductively coupled plasma coating reactor systems is the difficulty in obtaining uniformity in the coating. For example, a Faraday dark space typically exists near the center of an induction coil. This can contribute to a non-uniform distribution of the coating. Other phenomena, not entirely understood, may also contribute to non-uniformity in the deposition process when using an induction coil.

It is an object of the present invention to provide an improved deposition reactor system and method for producing a coating containing a predetermined component on a substrate from a plasma containing such component in an ionized state.

Another object of the invention is to provide an improved inductively coupled plasma deposition reactor system and method.

Another object of the invention is to provide a plasma deposition system and method which minimizes contamination problems and, in addition, which enables the production of uniform deposits at power levels which are significantly higher than those achieved by the prior art.

Figure 2:
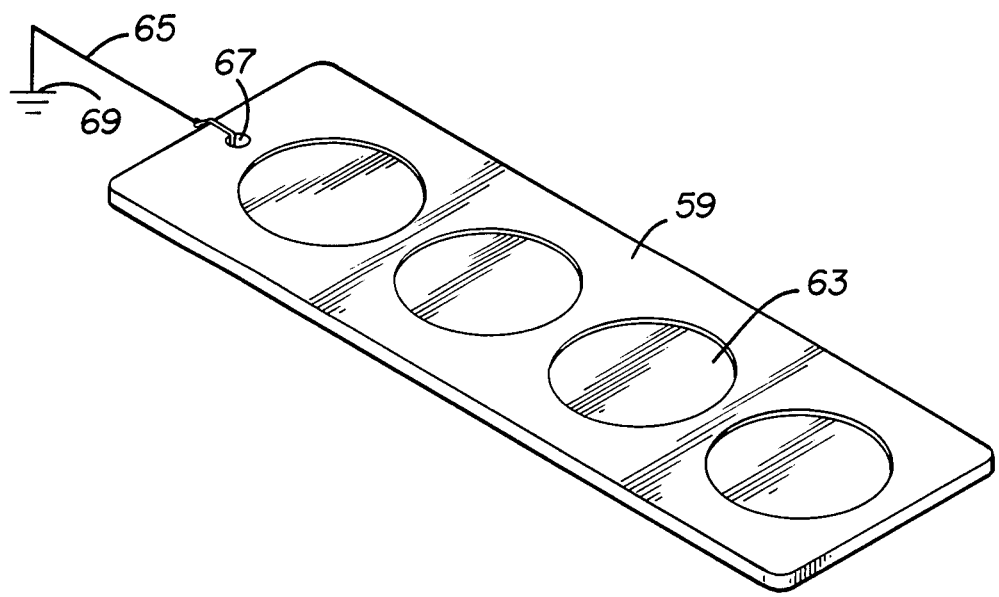

Other objects of the invention will become apparent to those skilled in the art from the following description, taken in connection with the accompanying drawings wherein:

FIG. 1 is a schematic perspective view of a deposition reactor system constructed in accordance with the invention; and FIG. 2 is a perspective view of an alternate form of susceptor which may be employed in the system of FIG. 1.

Very generally, in the deposition reactor system of the invention, a coating is produced containing a predetermined component on a substrate from a plasma containing such component in an ionized state. For example, using the invention, silicon nitride coatings can be produced on silicon substrates from a plasma gas containing nitrogen in an ionized state. The system includes a reactor chamber to which a gas containing the predetermined component is introduced. A susceptor within the reactor chamber supports the substrate to be coated. An induction coil is positioned for inductively coupling a radio frequency field to the gas for forming a plasma in the reactor chamber in the region of the susceptor. The susceptor is maintained at ground potential in the radio frequency field.

Referring now more particularly to FIG. 1, a deposition reactor system constructed in accordance with the invention is shown. The system includes a quartz tube 11 which defines a reactor chamber 13 in which the substrate being coated is supported, as will be described below. One end of the quartz tube 11 is partially closed by an end wall 15 having an opening 17 therein.

A glass tube 19 is suitably secured to the wall 15 at the opening 17, such as by an annular weld 21. The glass tube 19 has an opening 23 therein for a pressure sensor tube 25 which communicates with a suitable pressure transducer, such as a capacitance manometer 27. The manometer 27 is connected to a pressure controller 29 which controls the operation of a butterfly valve 31 located in the tube 19 downstream from the opening 17. The end of the tube 19 opposite the opening 17 communicates with a molecular sieve 33, which is further connected via a gate valve 35 to a vacuum pump, not shown.

The end of the quartz tube 11 opposite the wall 15 is closed by a load door 37 of suitable construction. Typically, the load door 37 comprises a circular plate having an annular flange 39 thereon surrounding the quartz tube 11 and sealed thereto by a suitable annular seal, not shown. The substrates to be coated are placed in the reactor chamber 13, as will be explained below, by opening the load door 37 and then closing it.

Gas is introduced to the reactor chamber 13 through the load door 37 by a gas inlet passage 43. The gas inlet passage is connected to a suitable source of reaction gas or gases, supplied through a gas supply flow control system 44. The reaction gases may be of any selected single gas or group of gases depending upon the substrate and the type of coating to be produced.

An induction coil 45 surrounds the quartz cylinder 11 on the outer surface thereof. The induction coil, which contains a passage 47 therein for water cooling from a cooling supply, not shown, is of a helical configuration coaxial with the cylindrical quartz tube 11. The coil 45 is electrically connected to a radio frequency generator 51 of suitable construction to produce, for example, radio frequency energy at a frequency range of 160 to 420 kilohertz.

For the purpose of monitoring the temperature of the substrate within the reactor chamber, an optical pyrometer 53 is suitably positioned and is connected to a temperature controller 55 and a driver amplifier 57. The temperature controller regulates the current in the coil 45 via the R.F. generator 51 in accordance with the temperature of the substrate sensed by the optical pyrometer. The temperature may be a preset temperature level set in the temperature controller. Various devices for accomplishing such temperature control are well known in the art and therefore are not described in detail herein.

In order to support the substrate or substrates being coated within the reactor chamber 13, a support device, commonly known as a susceptor, is utilized. The susceptor shown in FIG. 1, indicated at 59, is a generally flat plate having a plurality of circular recesses 61 in its upper surface for supporting circular wafers of silicon (not shown) for producing a coating of silicon nitride on the silicon wafers. Such coatings are useful in the production of semiconductor devices and the like for oxidation protection, insulation purposes and active dielectrics in devices. Typically, the susceptor 59 is comprised of graphite which is provided with a coating of silicon carbide in order to render the susceptor inert to the deposition reactions taking place within the reactor chamber 13.

In operating the illustrated deposition reactor system, a gas or gases containing a component to be reacted with the substrate are introduced from the gas supply flow control system 44 via the gas conduit or tube 43. The internal pressure of the reactor chamber 13 is maintained via the pressure controller 29 connected to the vacuum pump, not shown. Radio frequency energy is applied to the coil 45, resulting in the production of an electromagnetic field within the reactor chamber 13 in the region of the susceptor 59 and the substrates in the recesses 61. The radio frequency energy is coupled to the gases flowing in the reactor chamber 13. The gas molecules are therefore ionized by the field. At the same time, the radio frequency energy is electromagnetically coupled to the susceptor 59.

In accordance with the invention, the susceptor 59 is maintained at a ground potential, rather than floating as is the case in prior art systems. This seemingly innocuous modification results in surprising and significant improvements over the operation of prior art reactor systems More particularly, by grounding the susceptor 59, the plasma is confined to the volume encased by the coil 45 and the intensity of the plasma within this region can be maintained at significantly higher levels. By way of example, in a system wherein the susceptor 59 is ungrounded, the pressure required to confine the plasma to the coil region and prevent the plasma from extending the entire length of the quartz tube 11 can be as much as 400 times higher than the pressure required to achieve the same thing with the susceptor 59 grounded. An additional advantage of grounding the susceptor 59 is that a Faraday dark space near the center of the coil 45 is eliminated, resulting in a very uniform distribution of field within the coil. The result is a significant improvement in the uniformity of deposition on the substrates.

Although not entirely understood, it is believed that the grounding of the susceptor confines the plasma to the susceptor region even at extremely low pressures. Without grounding, as the pressure is reduced within the reactor chamber 13, the plasma becomes more intense and the activated species travel a greater distance and can actually reach the ends of the quartz tube 11, resulting in contamination because of arcing reactions between the plasma and metal components of the reactor. In accordance with the invention, there is essentially no arcing within the chamber and the confinement of the plasma to the region of interest results in a superior quality deposit.

In grounding the susceptor 59, the embodiment of FIG. 1 employs an appendage or projection 63 extending from one end of the main susceptor plate 59. The extension 63 is long enough to project beyond the end of the coil 45 adjacent the load door, which is also the high potential end of the coil. A suitable conductor 65, such as a wire, is tied or otherwise attached, through a hole 67 provided at the end of extension 63. The wire is attached to the interior surface of the conducting load door. A wire is attached to the exterior of the load door and is terminated at a ground connection 69. The silicon carbide coating on the susceptor 59 is extended along the extension 63 in order to prevent plasma sputtering of the carbon susceptor and a consequent incorporation of carbon contamination of the coating on the substrates. At the point where the conductor 65 is connected to the extension, the silicon carbide coating is removed so as to provide adequate electrical connection. However, since this is out of the region within the coil 45, the sputtering problem is avoided.

An alternate technique of grounding is shown in FIG. 2. Here the electrical conductor 65 is connected directly to the susceptor 59 through a hole 67. Since the hole 67 is within the coil 45, the silicon carbide coating is necessary at the point of contact between the electrical conductor and the susceptor. This may result in a limitation on grounding efficiency as a result of the high contact resistance of the silicon carbide coating.

It may be seen, therefore, that the invention provides an improved plasma deposition reactor system and method which reduces contamination problems and provides a significant improvement in uniformity of the deposit. The reactor system and method of the invention is of particular benefit in plasma reactions with semiconductor substrates to form high purity dielectric layers. Plasma confinement and unform plasma intensity are achieved over a wide range of pressures and temperatures, even at high power levels.

Various modifications of the invention in addition to those shown and described herein will become apparent to those skilled in the art from the foregoing description and accompanying drawings. Such modifications are intended to fall within the scope of the appended claims.

What is claimed is:

1. A deposition reactor system for producing a coating containing a predetermined component on a substrate from a plasma containing such component in an ionized state, said reactor system comprising, means defining a reactor chamber, means for introducing a gas containing the predetermined component to said reactor chamber, susceptor means for supporting the substrate to be coated within said reactor chamber, induction heating means including coil means positioned for inductively coupling a radio frequency field to the gas for forming a plasma in said reactor chamber in the region of said susceptor means, and means for maintaining said susceptor means at ground potential in the radio frequency field.

2. A system according to claim 1 wherein said grounding means are positioned proximate an end of said coil means.

3. A system according to claim 1 wherein said grounding means include a portion of said susceptor means within said reactor chamber extending beyond said coil means.

4. A method for operating a deposition reactor system for producing a coating containing a predetermined component on a substrate from a plasma containing such component in an ionized state, wherein the reactor system includes a reactor chamber, a susceptor for supporting the substrate to be coated within the reactor chamber, and an induction coil surrounding the susceptor for producing a radio frequency field for forming a plasma in the reactor chamber in the region of the susceptor, said method comprising, introducing a gas containing the predetermined component to the reactor chamber, inductively coupling a radio frequency magnetic field to the gas for forming a plasma in the reactor chamber in the region of the susceptor by energizing the coil with a radio frequency current, and maintaining the susceptor at ground potential in the radio frequency magnetic field.

5. A method according to claim 4 wherein the susceptor is held at a temperature below about 750° C.

6. A method according to claim 4 wherein the predetermined component is a chemical element.

7. A method according to claim 4 wherein the predetermined component is nitrogen.

8. A method according to claim 4 wherein the substrate is silicon.

9. A method according to claim 4 wherein the gas pressure in the reactor is less than atmospheric.

* * * * *